United States Patent [19]

Tsuruta et al.

[11] Patent Number: 4,752,705

[45] Date of Patent: Jun. 21, 1988

[54] OFF-GATE CIRCUIT FOR A GTO THYRISTOR

[75] Inventors: Yukinori Tsuruta, Sagamihara; Kazuto Kawakami, Fuchu, both of Japan

[73] Assignee: Kabushiki Kaisha Toshiba, Kawaski, Japan

[21] Appl. No.: 937,917

[22] Filed: Dec. 4, 1986

[30] Foreign Application Priority Data

Dec. 16, 1985 [JP] Japan .................................. 60-282402

[51] Int. Cl.$^4$ ............................................. H03K 17/72
[52] U.S. Cl. ..................................... 307/633; 307/264; 307/305
[58] Field of Search ............... 307/305, 264, 268, 633, 307/639, 642

[56] References Cited

U.S. PATENT DOCUMENTS 4,292,550  9/1981  Onda et al. ..................... 307/252 C
4,464,585  8/1984  Seki ..................... 307/252

FOREIGN PATENT DOCUMENTS 0113238  9/1979  Japan .............................. 307/252 C
0051618  3/1983  Japan .............................. 307/252 C
0115617  7/1984  Japan .............................. 307/252 C Primary Examiner—John Zazworsky
Attorney, Agent, or Firm—Finnegan, Henderson, Farabow, Garrett and Dunner

[57] ABSTRACT

An off-gate circuit for a GTO thyristor comprises a power source for supplying current to the circuit at a predetermined voltage, and a switching circuit connected to the power source for supplying off-gate current to the GTO thyristor at least two different current rates.

8 Claims, 4 Drawing Sheets

F I G. 1
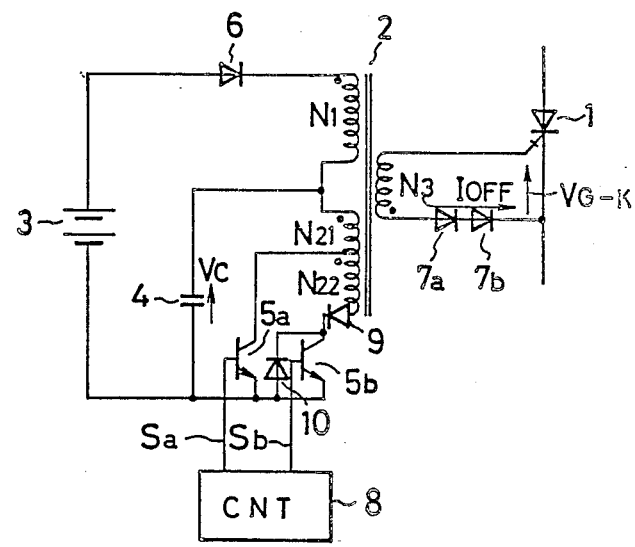

(a)　　　(b)

(a)

(b)

OFF-GATE CIRCUIT FOR A GTO THYRISTOR

BACKGROUND OF THE INVENTION

1. Field of the Invention

This invention relates to an off-gate circuit for a gate-turn-off thyristor (hereinafter simply referred to as an off-gate circuit for a GTO thyristor, and more particularly to an off-gate circuit for a GTO thyristor having a control device for reducing turn-off loss.

2. Description of Background

Hitherto, a circuit such as that shown in FIG. 4 has been used as an off-gate circuit with a pulse transformer.

In FIG. 4, a GTO thyristor 1 has a gate connected to one end of a secondary winding $N_3$ of a pulse transformer 2, and a cathode connected through diodes $7a$ and $7b$ to the other end of the secondary winding $N_3$. A gate power source 3 is connected through a diode 6 to one end of a primary winding $N_1$ of the pulse transformer 2 so as to supply gate power. The other end of the primary winding $N_1$ is connected to one end of a primary winding $N_2$ and also to one end of a capacitor 4. The other end of the primary winding $N_2$ is connected through a transistor 5 to the other end of the capacitor 4 and also to the negative side of the gate power source 3.

FIG. 5(a), waveforms (I) through (III), illustrate respective waveforms in the operation of the circuit shown in FIG. 4. FIG. 5(a) waveform (I) represents a voltage waveform $V_C$ across the capacitor 4, FIG. 5(a) (II), an off-gate current $I_{OFF}$ produced from the secondary winding $N_3$ of the pulse transformer 2, and FIG. 5(a), waveform (III), a voltage waveform $V_{G-K}$ between the gate and cathode of the GTO thyristor 1.

At a time $t_0$, the capacitor 4 is charged with a polarity $V_{CO}$. The transistor 5, as shown in FIG. 4, is turned on when a base signal is fed into the transistor 5. The charge on the capacitor 4 then is discharged through the primary winding $N_2$ of the pulse transformer 2 and the transistor 5 so as to induce a voltage within the secondary winding $N_3$.

The output current $I_{OFF}$ from the secondary winding $N_3$ is produced as a negative current between the cathode and the gate of the GTO thyristor 1. Diodes $7a$ and $7b$ prevent penetration of the on-gate current of an on-gate current circuit (not shown). During the period $T_{OFF}$ from the time $t_0$ to a time $t_1$, the base signal is fed into the transistor 5, which remains turned on. After the period $T_{OFF}$, the transistor 5 is turned off (at the time $t_1$), and an exciting current of the pulse transformer 2 flows through a path of the positive side of the gate power source 3, the diode 6, the primary winding $N_1$ of the pulse transformer 2, the capacitor 4, and the negative side of the gate power source 3, whereby the capacitor 4 is recharged. An equilvalent circuit in this state is shown in FIG. 5(b).

In recent years there has been a need for a power converter apparatus employing larger-capacity GTO thyristors which have a higher switching frequency for pulse width modulation (PWM) control or the like.

In this case, successful reduction of switching loss within the GTO thyristors can raise the frequency limit which is caused by thermal restrictions.

SUMMARY OF THE INVENTION

It is an object of this invention to reduce turn-off loss of a GTO thyristor.

Another object of this invention is to supply a GTO thyristor with current at two different rates.

The foregoing objects are achieved according to the present invention by providing an off-gate circuit for a GTO thyristor which has a power source means for supplying current to the circuit at a predetermined voltage, and a switching means connected to the power source means for supplying an off-gate current to the GTO thyristor in at least two different current rates for reducing turn-off loss of the thyristor.

Additional objects and advantages will be obvious from the description which follows, or may be learned by the practice of the invention.

BRIEF DESCRIPTION OF THE DRAWINGS

A more complete appreciation of the invention and many attendant advantages thereof will be readily understood as the same is explained by reference to the following detailed description in connection with the accompanying drawings, wherein:

FIG. 1 is a schematic diagram illustrating one embodiment according to the present invention, FIG. 2 (waveforms a and b) illustrates characteristic waveforms for GTO thyristors depicted in order to explain the preferred embodiments of the present invention, FIG. 3, waveforms (I) through (IV), are diagrams of waveforms for respective parts of the GTO thyristor explaining the preferred embodiments of the present invention.

DESCRIPTION OF THE PREFERRED EMBODIMENTS

Figure 4:
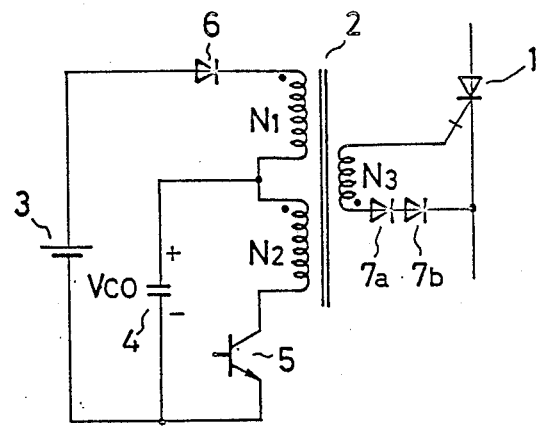
FIG. 4 is a schematic diagram illustrating a conventional circuit.

Referring now to FIG. 1, one embodiment of the present invention will be described. In FIG. 1, parts identical to or corresponding to those in FIG. 4 are designated by like reference numerals, so that the descriptions thereof will be omitted. Tap terminals are provided on a winding $N_2$ of primary windings of a pulse transformer 2 to form windings $N_{21}$ and $N_{22}$. These are driven by transistors $5a$ and $5b$. Base signals of the transistors $5a$ and $5b$ are supplied from an ON-OFF control circuit 8. A diode 9 prevents the winding $N_{22}$ from being short-circuited when the transistor $5a$ is turned on, while a diode 10 prevents a reverse voltage from being applied to the transistor $5b$.

Figure 2:
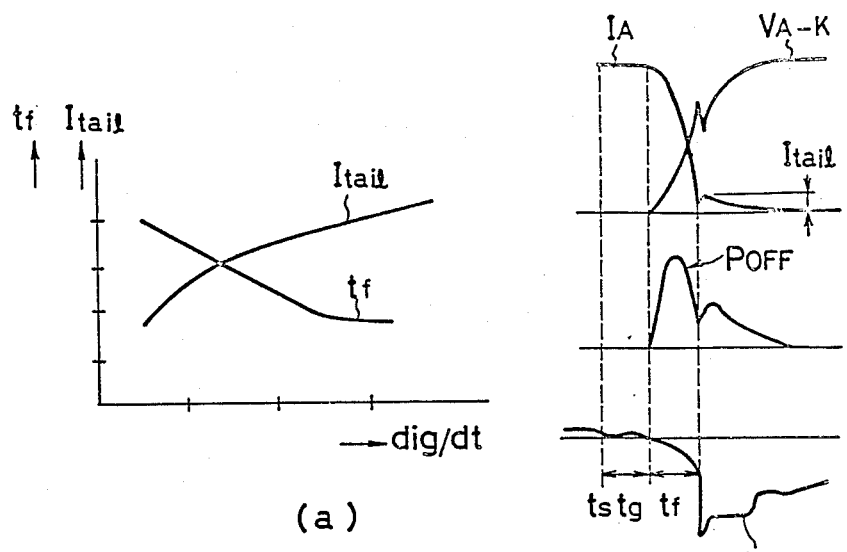
Figure 3:
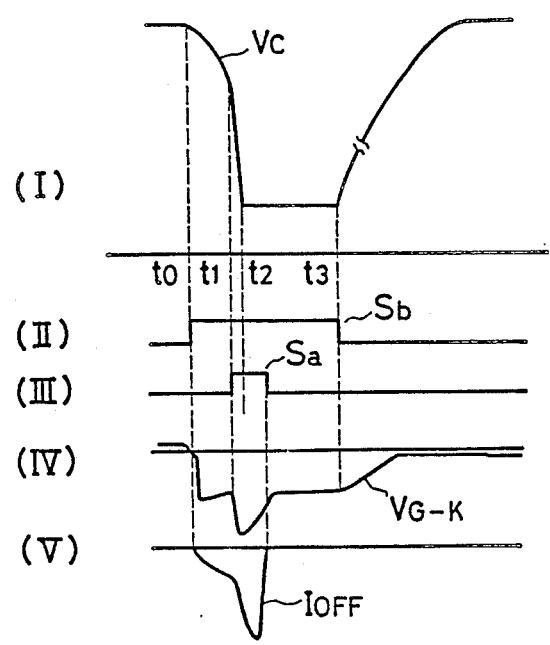

Next, operation of this embodiment will be described with reference to FIGS. 1, 2 and 3. In general, turn-off characteristics of GTO thyristors are such that when the off-current change rate, $di_g/dt$, is lowered, the tail current becomes smaller. However, the gate power source voltage $E_g$ also becomes lower when the change rate $di_g/dt$ is lowered. When the gate power source voltage $E_g$ decreases, the fall time $t_f$ increases, and the maximum interruption current $I_{ATO}$ (max) tends to decrease by the amount of increased power loss caused by the lengthened fall time $t_f$. When the change rate $di_g/dt$ is increased, both the storage time $t_{stg}$ and the fall time $t_f$ decrease. However, the tail current $I_{tail}$ increases. This relationship between $t_f$ and $I_{tail}$ is shown in FIG. 2(a). FIG. 2(b) illustrates characteristics in the case of turn-off, which represent the relationship of an anode current $I_A$, a voltage $V_{A-K}$ between the anode and cathode, turn-off loss $P_{OFF}$, and a voltage $V_{G-K}$ between the gate and cathode. Instanteous loss upon turn-off increases in proportion to increases is the fall time or the tail current. To reduce turn-off loss, the characteristics of the GTO thyristor should be utilized in a control method, as shown in FIG. 3, with respect to the circuit of FIG. 1. The change rate dig/dt in the first part of the storage time $t_{stg}$ is made to be lowered to decrease the tail current $I_{tail}$, and the change rate dig/dt in the latter part of the storage time $t_{stg}$ is made to be increased to decrease the fall time $t_f$.

The above control method is very effective to decrease the turn-off loss because the fall time $t_f$ is more influenced by the change rate dig/dt in the latter part of the storage time $t_{stg}$ than by that in the first part of the storage time $t_{stg}$. In FIG. 3, (I) shows a waveform of the voltage across the capacitor 4, (II) a base control signal $S_b$ of the transistor 5b, (III) a base control signal $S_a$ of the transistor 5a, (IV) an assumed waveform between the gate and cathode of GTO thyristor when employing the control method, and (V) an off-gate current waveform. During the period from a time $t_0$ to a time $t_1$, the transistor 5b is turned on, and an off-gate current of lower change rate dig/dt is produced through the windings $N_{21}$ and $N_{22}$ in series. During the period from the time $t_1$ to a time $t_2$, the transistor 5a is turned on, and an off-gate current $I_{OFF}$ of higher change rate dig/dt is produced through the winding $N_{21}$. These operations are periodically repeated to perform necessary switchings. Other modified methods which do not use pulse transformers may be utilized to effect changeover from the off-gate current of lower dig/dt to the off-gate current of higher dig/dt.

Figure 6:
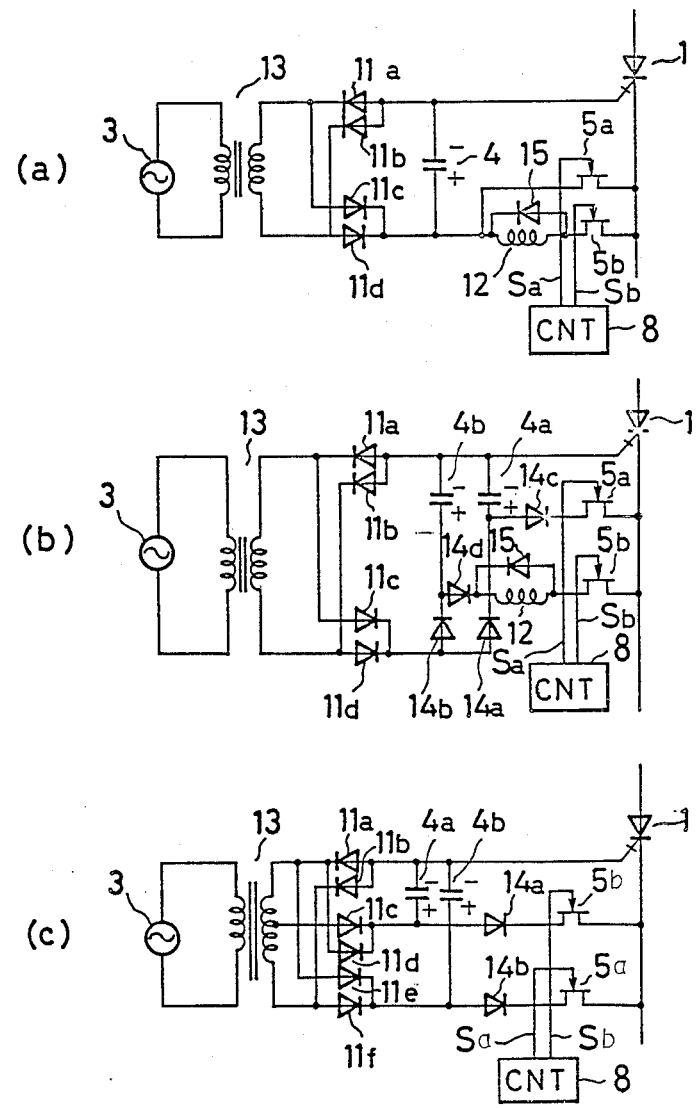
FIG. 6(a) through 6(c) are schematic diagrams illustrating other preferred embodiments of the present invention.

These modified embodiments are shown in FIGS. 6(a), 6(b) and 6(c), wherein parts identical to those in FIG. 1 are designated by identical reference numerals, so that the description thereof may be omitted. Reference numerals 11a through 11f designate diodes, 12 designates an impedance component (here, a reactor is described, for example), 13 designates a transformer, and 14a through 14d and 15 denote diodes. In FIG. 6(a) a switching component 5b functions to suppress discharge of the charge on the capacitor 4 through an impedance component 12 to produce an off-gate current of lower dig/dt. Here, the reactor is described for example, so that the diode 15 is provided in parallel therewith to suppress the occurrence of overvoltage. However, in the case of a resistor, such a diode is unnecessary. After a specified time has elapsed, a switching component 5a is turned on to produce an off-gate current of higher dig/dt. Further, as shown in FIG. 6(b), a capacitor which supplies an off-gate current that changes from a lower dig/dt to a higher dig/dt may be separated into capacitors 4a and 4b. These are provided with diodes 14c and 14d, respectively, for suppressing cross currents between the capacitors 4a and 4b. Moreover, as shown in FIG. 6(c), the impedance component 12 may be replaced by a transformer 13. The transformer 13 has a tap terminal so that the charged voltage of the capacitor 4a may be made lower than that of the capacitor 4b. A plurality of power source of different voltages also may be provided, so that operation of switching component 5b produces an off-gate current of lower dig/dt while operation of the switching component 5a produces an off-gate current of higher dig/dt.

What is claimed is:
1. An off-gate control circuit for a GTO thyristor having an anode, a gate and a cathode, comprising:
   a power source for supplying current of a predetermined at least one corresponding voltage level to the control circuit; and
   switching means, operatively coupled between the power source and the GTO thyristor, for receiving the control circuit current, for inducing an off-gate current having increasing rates of change of current flow in the GTO thyristor between the gate and the cathode, and for selectively switching the increasing rates of change of the induced off-gate current between at least a first, lower current rate of change and a second, higher current rate of change to reduce turn-off loss of the thyristor.
2. The off-gate control circuit of claim 1, wherein the switching means includes:
   chargeable and dischargeable capacitor means coupled to the power source, the capacitor means being charged with the corresponding voltage by the power source;
   current-inducing means coupled between the power source and capacitor means, and the GTO thyristor, and comprising windings, for receiving the control circuit current, and for inducing the off-gate current having the at least first and second rate of change of current flow in the GTO thyristor in response to the discharging of the capacitor means; and
   a discharging circuit coupled to the current-inducing means and the capacitor means for discharging the capacitor means.
3. The off-gate control circuit of claim 2 wherein the switching means further includes first and second switches, the first switch being operatively connected to the current-inducing means for controlling the current-inducing means to induce off-gate current having the first rate of change of current flow, the second switch being operatively connected to the current-inducing means for controlling the current-inducing means to induce off-gate current having the second rate of change of current flow in the GTO thyristor.
4. The off-gate control circuit of claim 3 wherein the switching means further includes control means for controlling the first and second switches to selectively cause the switching means to induce the first and second rates of change for the off-gate current.
5. The off-gate control circuit of claim 4, wherein the capacitor means has an associated rate of discharge and the first switch includes impedance means for suppressing the rate of discharge of the capacitor means to induce the off-gate current having the first rate of change of current flow.
6. The off-gate control circuit of claim 5, wherein the capacitor means includes first and second capacitors chargeable with a first, lower voltage and a second, higher voltage, respectively, the first and second capacitors being charged by the power source.
7. The off-gate control circuit of claim 6, wherein the first capacitor is operatively connected to the first switch and the second capacitor is operatively connected to the second switch, the first and second switches being responsive to the first and second capacitors, respectively, to cause the switching means to induce the first and second rates of change for the off-gate current.
8. The off-gate control circuit of claim 5 wherein the impedance means includes a reactor having a diode connected in parallel therewith.

* * * * *

UNITED STATES PATENT AND TRADEMARK OFFICE
CERTIFICATE OF CORRECTION

PATENT NO. : 4,752,705

DATED : June 21, 1988

INVENTOR(S) : Yukinori Tsuruta et al.

It is certified that error appears in the above-identified patent and that said Letters Patent is hereby corrected as shown below:

Title page, change "Assignee: Kabushiki Kaisha Toshiba, Kawaski, Japan" to --Kabushiki Kaisha Toshiba, Kawasaki, Japan--.

In the BACKGROUND OF THE INVENTION, column 1, line 56, change "equilvalent" to --equivalent--.

In the CLAIMS, column 4, line 26, change "having the at least" to --having at least the--.

UNITED STATES PATENT AND TRADEMARK OFFICE
CERTIFICATE OF CORRECTION

PATENT NO. : 4,752,705

DATED : June 21, 1988

INVENTOR(S) : Yukinori Tsuruta et al.

Figure 5:
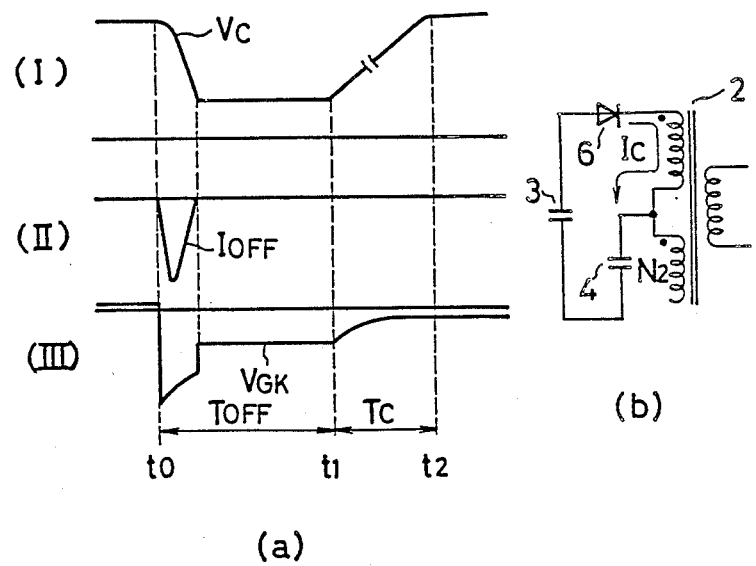
FIG. 5(a), waveforms (I) through (III), are diagrams for respective parts of the GTO thyristor explaining the operation of the conventional circuit.
FIG. 5(b) is an equivalent circuit diagram explaining operations of the conventional circuit.

It is certified that error appears in the above-identified patent and that said Letters Patent is hereby corrected as shown below:

In the DRAWINGS, Sheet 3 of 4, Figure 5(b). should appear as shown below:

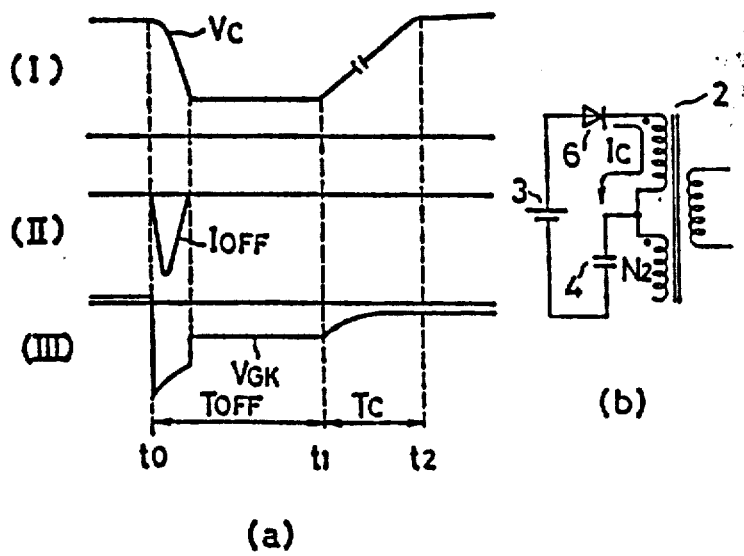

FIG. 5 (PRIOR ART)

Signed and Sealed this

Twenty-sixth Day of September, 1989

Attest:

DONALD J. QUIGG

Attesting Officer

Commissioner of Patents and Trademarks